United States Patent [19]

Drake et al.

[11] Patent Number: 5,041,190

[45] Date of Patent: Aug. 20, 1991

[54] METHOD OF FABRICATING CHANNEL PLATES AND INK JET PRINTHEADS CONTAINING CHANNEL PLATES

[75] Inventors: Donald J. Drake, Rochester; James F. O'Neill, Penfield, both of N.Y.

[73] Assignee: Xerox Corporation, Stamford, Conn.

[21] Appl. No.: 524,072

[22] Filed: May 16, 1990

[51] Int. Cl.[5] .................... H01L 21/306; B44C 1/22; C03C 15/00; C03C 25/06

[52] U.S. Cl. .................... 156/647; 156/644; 156/651; 156/657; 156/661.1; 156/662; 437/226; 346/140 R

[58] Field of Search .............. 156/633, 644, 645, 647, 156/651, 653, 657, 661.1, 662; 437/226, 228; 346/1.1, 75, 140 R

[56] References Cited

U.S. PATENT DOCUMENTS

| | | | |
|---|---|---|---|
| 3,701,696 | 10/1972 | Mets | 437/226 X |
| 4,169,008 | 9/1979 | Kurth | 156/600 |
| 4,604,161 | 8/1986 | Araghi | 156/645 |
| 4,786,357 | 11/1988 | Campanelli et al. | 156/633 |
| 4,814,296 | 3/1989 | Jedlicka et al. | 437/226 |
| 4,822,755 | 4/1989 | Hawkins et al. | 437/227 |
| 4,829,324 | 5/1989 | Drake et al. | 346/140 R |
| 4,851,371 | 7/1989 | Fisher et al. | 437/226 |
| 4,961,821 | 10/1990 | Drake et al. | 156/647 |

*Primary Examiner*—William A. Powell

*Attorney, Agent, or Firm*—Oliff & Berridge

[57] ABSTRACT

A method of fabricating channel plates for ink jet printheads from a (100) silicon wafer is disclosed. The location of the nozzle-forming channels are accurately located relative to side edges of each channel plate to permit extended arrays of printheads containing these channel plates to be fabricated without discrepancies between the spacing of end nozzles of adjacent subunits. The present invention achieves this result by forming a first set of base etch openings and a second set of base etch openings on a base surface of a (100) silicon wafer. The first set of base etch openings define the locations of side edges of each channel plate. The second set of base etch openings define the locations and dimensions of a plurality of nozzle-defining channels for each channel plate. By aligning the second set of base etch openings with the first set of base etch openings, the channel plates which are formed after etching the silicon wafer have nozzle-defining channels which are precisely aligned with the side edges of each channel plate.

20 Claims, 3 Drawing Sheets

METHOD OF FABRICATING CHANNEL PLATES AND INK JET PRINTHEADS CONTAINING CHANNEL PLATES

BACKGROUND OF THE INVENTION

1. Field of the Invention

The present invention relates to methods of fabricating channel plates for ink jet printers having side edges that are precisely located relative to the channels formed therein, and more particularly to methods of forming ink jet printheads incorporating such channel plates.

2. Description of Related Art

Thermal ink jet printing systems use thermal energy selectively produced by resistors located in capillary filled ink channels near channel terminating nozzles or orifices to vaporize momentarily the ink and form bubbles on demand. Each temporary bubble expels an ink droplet and propels it towards a recording medium. The printing system may be incorporated in either a carriage type printer or a pagewidth type printer. The carriage type printer generally has a relatively small printhead, containing the ink channels and nozzles. The printhead is usually sealingly attached to a disposable ink supply cartridge and the combined printhead and cartridge assembly is reciprocated to print one swath of information at a time on a stationarily held recording medium, such as paper. After the swath is printed, the paper is stepped a distance equal to the height of the printed swath, so that the next printed swath will be contiguous therewith. The procedure is repeated until the entire page is printed. For an example of a carriage type printer, refer to U.S. Pat. No. 4,571,599 to Rezanka. In contrast, the pagewidth printer has a stationary printhead having a length equal to or greater than the width of the paper. The paper is continually moved past the pagewidth printhead in a direction normal to the printhead length and at a constant speed during the printing process. Refer to U.S. Pat. No. 4,829,324 to Drake et al for an example of pagewidth printing and especially FIGS. 10, 11 and 13 therein.

U.S. Pat. No. 4,829,324 mentioned above discloses a printhead having one or more ink filled channels which are replenished by capillary action. A meniscus is formed at each nozzle to prevent ink from weeping therefrom. A resistor or heater is located in each channel upstream from the nozzles. Current pulses representative of data signals are applied to the resistors to momentarily vaporize the ink in contact therewith and form a bubble for each current pulse. Ink droplets are expelled from each nozzle by the growth of the bubbles which causes a quantity of ink to bulge from the nozzle and break off into a droplet at the beginning of the bubble collapse. The current pulses are shaped to prevent the meniscus from breaking up and receding too far into the channels after each droplet is expelled. Various embodiments of linear arrays of thermal ink jet devices are shown, such as those having staggered linear arrays attached to the top and bottom of a heat sinking substrate for the purpose of obtaining a pagewidth printhead. Such arrangements may also be used for different colored inks to enable multi-colored printing.

In order to achieve higher output rates, it is desirable to use pagewidth printheads, such as disclosed in the above-mentioned U.S. Pat. No. 4,829,324. A preferred method of fabricating these pagewidth printheads involves butting a plurality of printhead subunits against one another to form an array of subunits having a length corresponding to the width of a page. It is desirable to use this subunit approach because it is difficult to form a monolithic printhead having a length corresponding to the width of a page. Monolithic printheads having the length of a pagewidth are also not preferred because one defective channel or heating element out of the 2,550 channels or heating elements contained in a monolithic printhead would render the entire printhead useless. In the subunit approach, each discrete subunit can be tested prior to assembly and thus only subunits are discarded if they contain a defective channel or heating element.

The printhead subunits are typically made from a heater plate which includes a plurality of resistive elements or heater elements formed on an upper surface thereof and a channel plate having a plurality of channels, corresponding in number and position to the heater elements, formed on a base surface thereof. The upper surface of the heater plate is bonded to the base surface of the channel plate so that a heater element is located in each channel. The channel plate can also include a fill hole, extending from its upper surface to its base surface, which is in fluid communication with the channels so that ink supplied from an ink source flows into the channels. The heater plate and channel plate are typically formed in separate (100) silicon wafers which are bonded to one another and diced with, for example, a precision dicing saw to form discrete printhead subunits. This technique lends itself to mass production of discrete printhead subunits because a plurality of heater plates can be formed in horizontal rows and vertical columns in one silicon wafer, a plurality of channel plates can be formed in horizontal rows and vertical columns in another silicon wafer, and the wafers can be bonded to each other and diced between each horizontal row and vertical column to form a plurality of printhead subunits. See, for example, previously cited U.S. Pat. No. 4,829,324 to Drake et al, the disclosure of which is herein incorporated by reference, which shows a plurality of arrangements of heater plates and channel plates for forming pagewidth printheads. In particular, FIGS. 12 and 13 show an embodiment wherein an etched silicon channel plate wafer is aligned and bonded to a silicon heater plate wafer after which the sandwiched wafers are diced to form multiple printhead subunits.

After dicing a wafer sandwich into multiple printhead subunits, a plurality of subunits are aligned in an array with the side edges or surfaces of adjacent subunits butting against one another and are bonded together to form, for example, a pagewidth printhead. One of the most critical parts of this task is in precisely delineating the discrete printhead subunits. Ink jet printhead subunit delineation is more difficult than standard chip dicing because the printhead subunit is a sandwich structure of two wafers: a heater plate wafer and a channel plate wafer. For example, FIG. 1 shows a first (100) silicon wafer 2 from which a plurality of channel plate subunits 4 are formed bonded to a second silicon wafer 20 from which a plurality of heater plate subunits 21 are formed. As seen from FIG. 1, a plurality of channel plate subunits 4 are formed in horizontal rows and vertical columns on (100) silicon wafer 2. In the example shown in FIG. 1, silicon wafer 2 need be only a one-side polished (100) silicon wafer which, after being chemically cleaned, has a silicon nitride layer (not shown) deposited on one side. Using conventional photolithography, vias for channel grooves 6 and fill holes 8 are printed on the silicon nitride layer. The silicon nitride is plasma etched off of the patterned vias representing the channel grooves 6 and fill holes 8 and a potassium hydroxide (KOH) anisotropic etch is used to etch channel grooves 6 and fill holes 8. In this case, the (111) planes of the (100) wafer make an angle of 54.7° with the surface of the wafer. The vias for fill holes 8 are sized so that they are entirely etched through wafer 2, whereas the vias for channel grooves 6 only etch partially through the wafer 2 as illustrated in FIG. 2.

Referring to FIG. 2, channel wafer 2 is bonded to heater wafer 20 which includes a plurality of heater plates 21, each including a set of heater elements 22 thereon. Each heater element includes a resistor having a passivated addressing electrode (not shown) so that current pulses representative of data signals can be selectively applied to each resistor. Silicon wafers 2 and 20 are bonded to each other so that a single heater element 22 is located in each channel 6. Wafers 2 and 20 are properly aligned with each other by forming alignment openings (not shown) in each wafer prior to or during formation of channels 6 and heater elements 22 on each respective wafer 2, 20.

After wafers 2 and 20 are bonded to each other, the wafer sandwich is separated into discrete printhead subunits by dicing between each row and column of mated sets of channels 6 and heater elements 22. The rows are separated out of the wafer by dicing along lines 10 and 12 and the printheads are separated out of each row by dicing along lines 14 and 16. Dicing along line 10 forms open ends or nozzles for each channel 6. Dicing along lines 14 and 16 with dicing blade 24 forms the side surfaces of each printhead. The preciseness with which the side surfaces of each printhead subunit is formed is critical because it controls the accuracy with which adjacent subunits are butted. Dicing blade 24 must cut through both channel wafer 2 and heater wafer 20 in the example of FIG. 2. Cutting through both wafers reduces the useful life of the cutting blade and also reduces the precision with which discrete printhead subunits can be formed as compared to an arrangement whereby dicing through only one wafer, for example, the heater wafer, is required. In particular, blade 24 tends to bend uncontrollably with increased thickness through which blade 24 must dice. This bending of blade 24 during dicing creates non-uniform side surfaces on the printhead subunits and reduces the accuracy with which subunits can be butted against each other.

U.S. Pat. No. 4,851,371 to Fisher et al, the disclosure of which is herein incorporated by reference, discloses a method of fabricating printhead subunits from a channel wafer/heater wafer sandwich wherein elongated slots 26 (see FIG. 3 of the present application) are formed on both ends of each set of channel grooves 6 for each channel plate 4 formed on silicon wafer 2. Elongated slots 26 are located so that dice cuts 14 and 16 which separate the printheads out of each row of printheads pass through grooves 26. As illustrated in FIG. 4, this construction permits printhead subunits to be formed wherein dicing blade 24 only dices through heater plate wafer 20 along the side surfaces of each subunit. Thus, elongated groove 26 reduces the thickness of silicon through which dicing blade 24 must cut, consequently increasing the usable life of dicing blade 24 and reducing the amount of uncontrollable blade bending to enable the production of precisely delineated printhead subunits. In the fabrication process of U.S. Pat. No. 4,851,371, channel wafer 2 is a two-side polished (100) silicon wafer which is cleaned and coated with a silicon nitride layer on both sides. Vias for elongated slots 26 are formed on one side of silicon wafer 2 while vias for channel groove 6 and fill holes 8 are formed on the opposite side of silicon wafer 2. As described above, the silicon nitride is plasma etched off of the pattern vias representing elongated slots 26, channel grooves 6 and fill holes 8 and the wafer 2 is then anisotropically etched by KOH to form a plurality of channel plates 4 in silicon wafer 2.

A problem fabricating this cross-sectional structure is that simple orientation dependent etching (ODE) through holes in commercial silicon wafers is not precise enough. This is because the dimensions of a through etch opening are a function of the wafer thickness as shown in FIG. 5. As discussed above, elongated slots 26 are etched through silicon wafer 2 from a side of silicon wafer 2 opposite from the side in which channel grooves 6 are formed. FIG. 5 illustrates that the location of the side edge 28 of each channel plate is controlled by the size of the opening $O_1$, $O_2$ that is formed by elongated slot 26 on the surface of silicon wafer 2 which contains channel grooves 6. As can be seen, the size of the opening $O_1$, $O_2$ is a function of the thickness $t_1$, $t_2$ of silicon wafer 2. As the thickness of silicon wafer 2 increases from $t_2$ to $t_1$, the size of the opening on the channel groove side of silicon wafer 2 decreases from $O_2$ to $O_1$. Consequently, since channels 6 are patterned on a side of wafer 2 opposite from the side on which channel groove 26 is formed, the distance which the end channel groove 6 is located from side edge 28 of channel plate 4 will increase from $d_2$ to $d_1$ with increased wafer thickness. This variation in distance $d_1$, $d_2$ of the end channel plate 6 from the side edge 28 of each channel plate 4 results in non-uniform spacing of the end channel grooves 6 between adjacent printhead subunits in an extended array (i.e. a pagewidth array) of printhead subunits. Additionally, if the thickness $t_1$ of silicon wafer 2 is excessively large, a portion of side edge 28 of channel plate 4 may extend into the dicing zone of dicing blade 24 and thus defeat some of the primary advantages of this fabrication method.

U.S. Pat. No. 4,822,755 to Hawkins et al also discloses the use of elongated slots in a (100) silicon wafer from which a plurality of channel plates are fabricated to form side edges of the channel plates. However, as with the above-mentioned U.S. Pat. No. 4,851,371, the end channels in each channel plate cannot be accurately located relative to the side edges of each channel plate due to variations in the thickness of the silicon wafers from which channel plates are fabricated.

OBJECTS AND SUMMARY OF THE INVENTION

It is an object of the present invention to provide a method of fabricating ink jet channel plate subunits wherein the locations of the end channels of each channel plate are precisely located relative to the side edges of the channel plate.

It is another object of the present invention to provide a method of fabricating ink jet printhead subunits which incorporate channel plates having end channels which are precisely located relative to the side edges of the channel plate.

It is another object of the present invention to reduce the amount of dicing required when separating columns of ink jet printhead subunits from a silicon wafer sandwich to increase the useful life of the dicing blade, reduce the amount of uncontrollable dicing blade bending and increase the uniformity of side edges of the printhead subunits.

It is a further object of the present invention to provide a pagewidth ink jet printhead formed from an extended array of printhead subunits wherein the spacing between the end channels of adjacent printhead subunits is uniform.

To achieve the foregoing and other objects, and to overcome the shortcomings discussed above, there is provided a method of fabricating a channel plate for an ink jet printhead from a (100) silicon wafer by precisely controlling the locations and dimensions of elongated slots which are formed in the silicon wafer and define the locations of side edges of the channel plate. The present invention fabricates channel plates from a two-side polished (100) silicon wafer by applying an etch resistant layer on upper and base surfaces of the wafer. The etch resistant layer on the upper surface is then patterned to produce a plurality of upper etch openings. The etch resistant layer on the base surface is patterned to produce a first set of base etch openings. Locations and dimensions of the first set of base etch openings define predetermined locations and dimensions of a plurality of side edges of the channel plate. Each of the base etch openings in the first set of base etch openings is aligned with a corresponding upper etch opening within a predetermined tolerance. A second set of base etch openings having locations and dimensions which define predetermined locations and dimensions of a plurality of channels is also patterned on the etch resistant layer of the base surface of the silicon wafer. The second set of base etch openings is aligned with the first set of base etch openings. The wafer is anisotropically etched to produce a plurality of upper recesses corresponding to the upper etch openings in the upper surface and a plurality of lower recesses corresponding to the first set of base etch openings in the base surface. Each of the upper and base recesses are bounded by (111) plane side walls, with the anisotropic etching of the lower recesses intersecting the upper recesses and forming a plurality of through holes. The anisotropic etching also produces a plurality of channels in the base surface corresponding to the second set of base etch openings. By this method, the location of side edges of the channel plate are controlled by the first set of base etch openings to which the second set of base etch openings which form the channel grooves are aligned whereby the location of the end channels in each channel plate are precisely located relative to the side edges of each channel plate regardless of the thickness of the silicon wafer.

A silicon wafer having a plurality of channel plate subunits formed by the above-described method and arranged in horizontal rows and vertical columns thereon can be bonded to another silicon wafer which includes an equal number of actuator plates arranged in corresponding horizontal rows and vertical columns. This wafer sandwich can be separated between each horizontal row and vertical column to form a plurality of printheads.

BRIEF DESCRIPTION OF THE DRAWINGS

The invention will be described in detail with reference to the following drawings in which like reference numerals refer to like elements and wherein.

DETAILED DESCRIPTION OF THE PREFERRED EMBODIMENT

The present invention utilizes two etch patterns, one on each side of the channel plate silicon wafer to precisely place the side edges of the channel plates formed in each silicon wafer. A similar method is disclosed in U.S. patent application Ser. No. 07/440,296, to Drake et al, filed Nov. 22, 1989, now U.S. Pat. No. 4,961,821 and assigned to the same assignee as the present application, the disclosure of which is herein incorporated by reference, where two etch patterns, one on each side of a heater plate wafer are removed and the wafer is etched to precisely locate side surfaces of the heater plates relative to the heater elements formed on an upper surface thereof. The present invention can be applied, for example, to form the channel plates used in the printhead subunits disclosed in U.S. Pat. Nos. 4,851,371 to Fisher et al and 4,822,755 to Hawkins et al to form printhead subunits where the width of each channel plate is slightly less than the width of each heater plate so that the precision diced side surfaces of each heater plate define the buttable surfaces for each printhead subunit. Alternatively, the channel plate wafer can be diced without being bonded to a heater plate wafer to produce a plurality of channel plate subunits which can be aligned with one another on a previously formed monolithic or extended array of heater plate subunits by, for example, butting as shown in the above-mentioned U.S. Pat. No. 4,829,324.

Figure 6A:
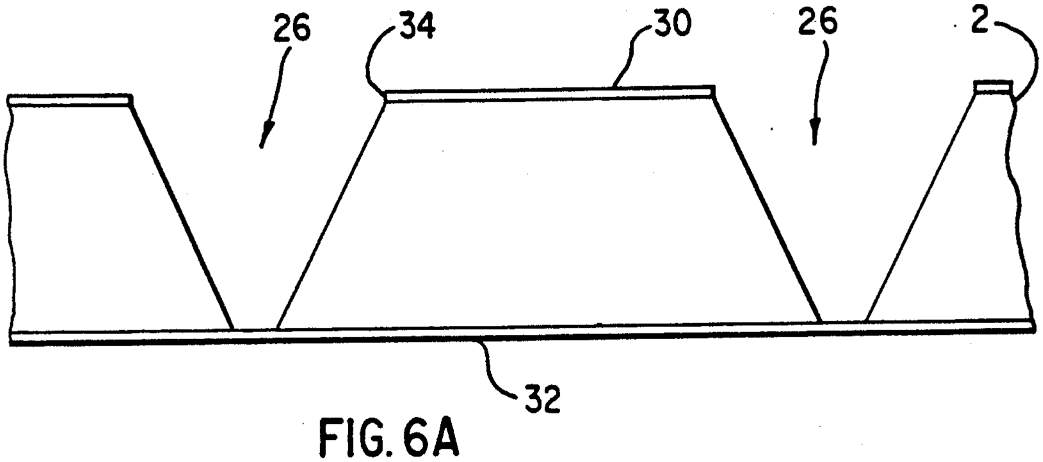
FIGS. 6*a*–6*c* show an embodiment of the present invention wherein the location of end channels of channel plates are precisely located relative to the side edges of each channel plate.

As shown in FIG. 6*a*, a two-side polished, (100) silicon wafer 2 is used to produce the plurality of channel plates 4 for mating with heater plate 21 to form a plurality of printhead subunits for use in a large array or pagewidth printhead. After wafer 2 is chemically cleaned, an etch resistant layer such as, for example, silicon nitride 30, 32 is applied on upper and base surfaces, respectively of wafer 2. Using conventional photolithography, the etch resistant layer 30 on the upper surface of wafer 2 is patterned to produce vias for elongated slots 26 to be formed on either side of each channel plate 4. The silicon nitride is plasma etched off of the patterned vias representing elongated slots 26 to form a plurality of upper etch openings 34. Wafer 2 is then etched by, for example, potassium hydroxide to form elongated slots 26. Slots 26 extend from the upper surface of wafer 2 to the base surface thereof. The etchant does not etch through etch resistant material layer 32 located on the base surface of wafer 2.

Figure 1:
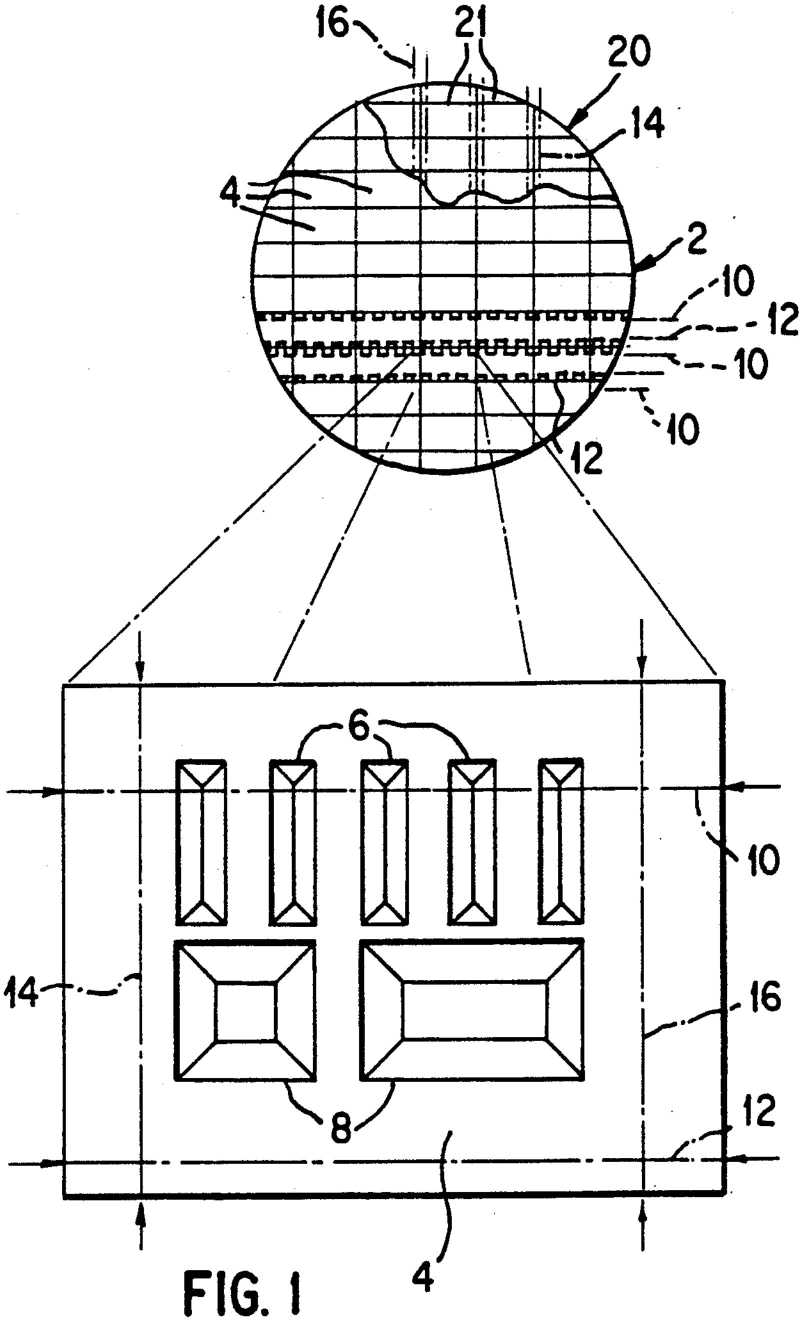
FIG. 1 is a schematic plan view of aligned and mated silicon wafers, the partially removed top wafer containing a plurality of etched channel plates, with one channel plate being shown enlarged, with some of the horizontal dicing lines shown in dashed line and the exposed bottom wafer containing a plurality of heating plates with some of the pairs of parallel vertical dicing lines shown in dashed line.
Figure 2:
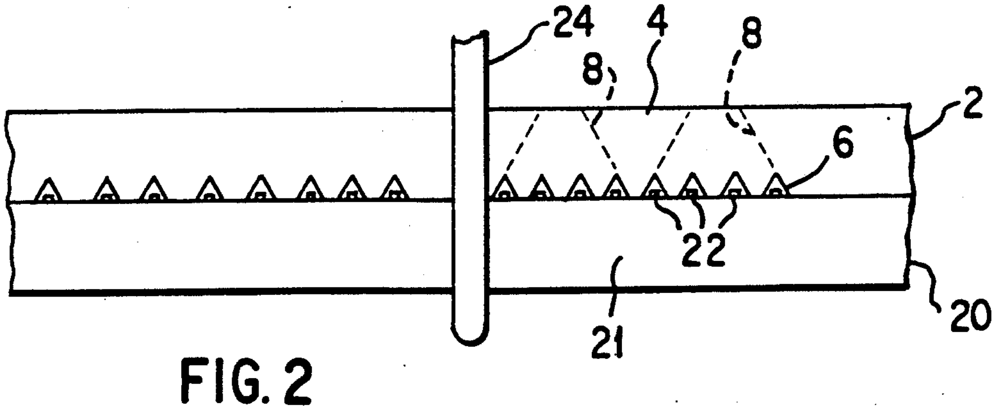
FIG. 2 is a partially shown, enlarged, schematic cross-sectional view of the heater plate wafer/channel plate wafer sandwich of FIG. 1 showing a vertical dicing cut by a dicing blade.
Figure 3:
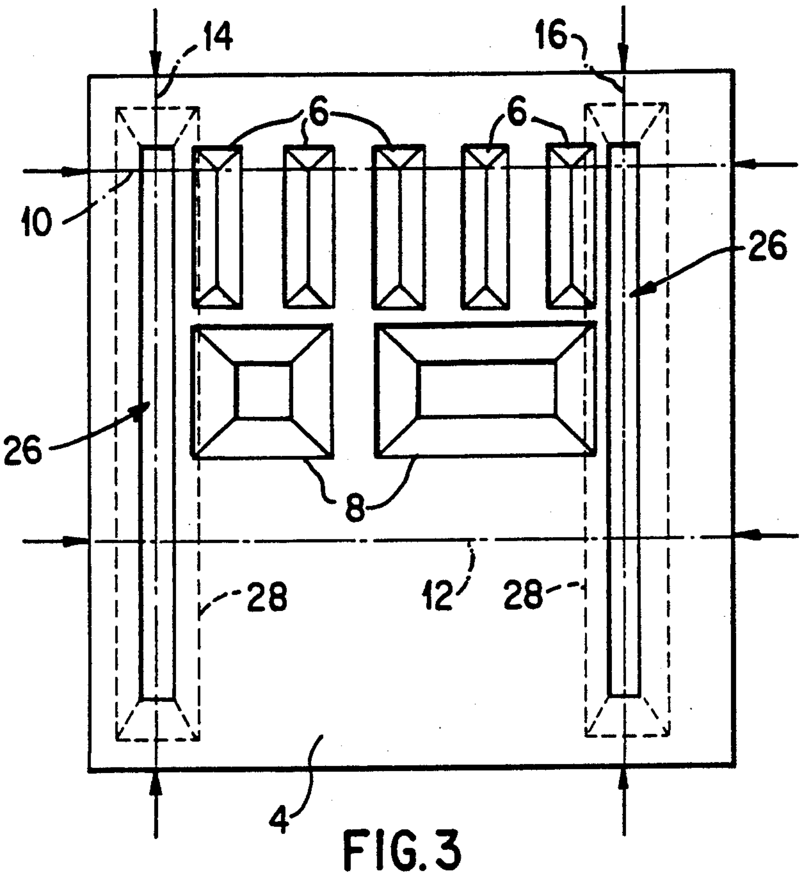
FIG. 3 is an enlarged, schematic plan view of one type of channel plate having elongated slots through which the dicing blade passes when cutting in the vertical direction.
Figure 4:
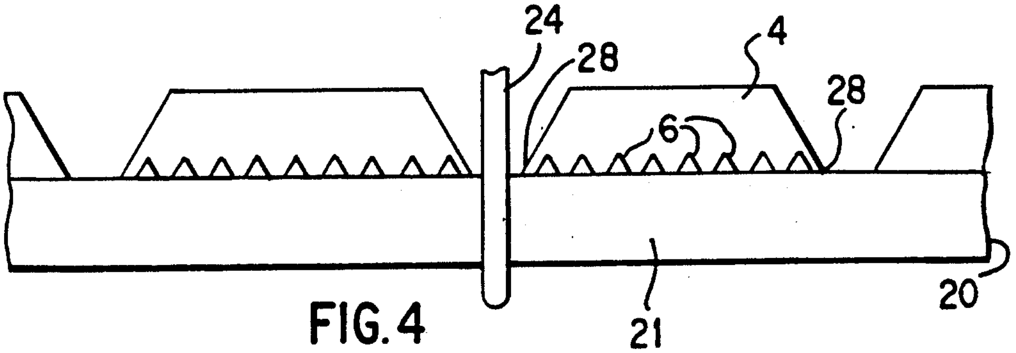
FIG. 4 is a cross-sectional view of a dicing blade cutting through a combined heater plate wafer and channel plate wafer shown in FIG. 3.
Figure 5:
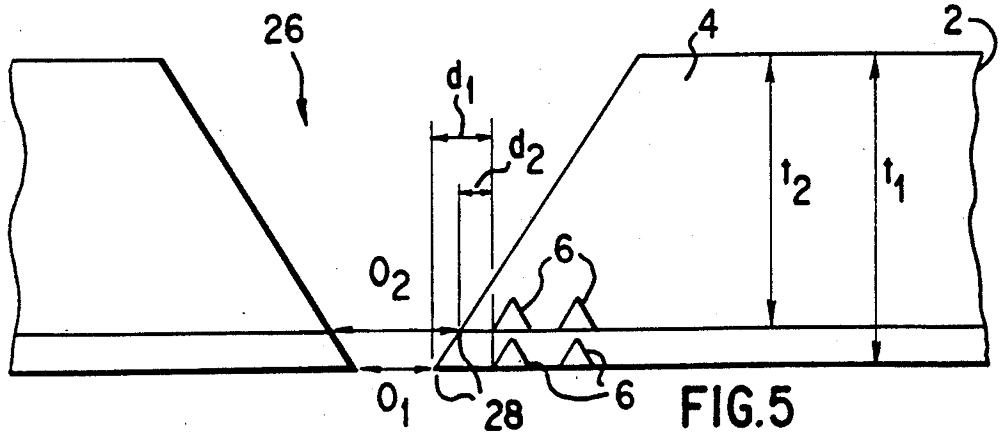
FIG. 5 shows the variable distance that an end channel is located from a side edge of a channel plate due to variations in the thicknesses of different silicon wafers when channel plates are formed by previous methods.
Figure 6B:
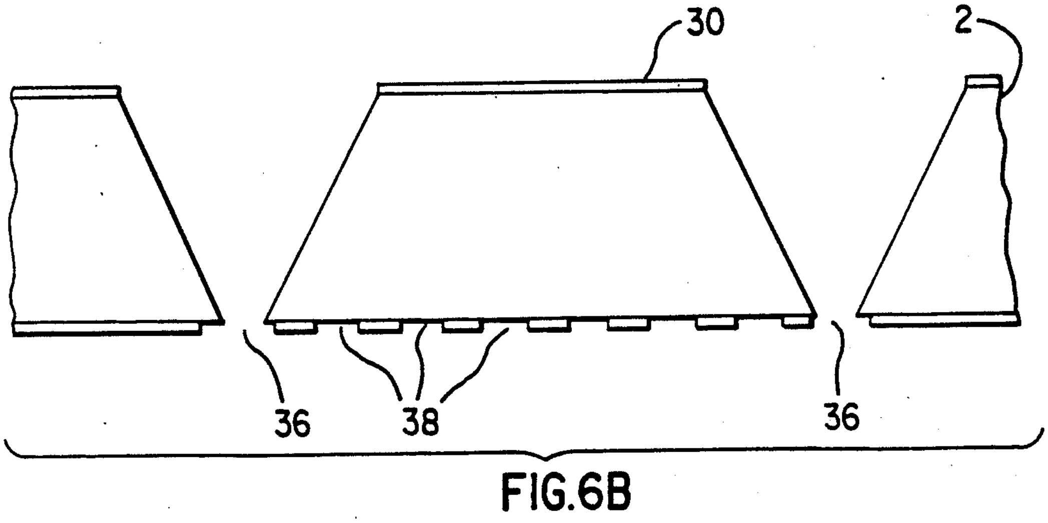
Figure 6C:
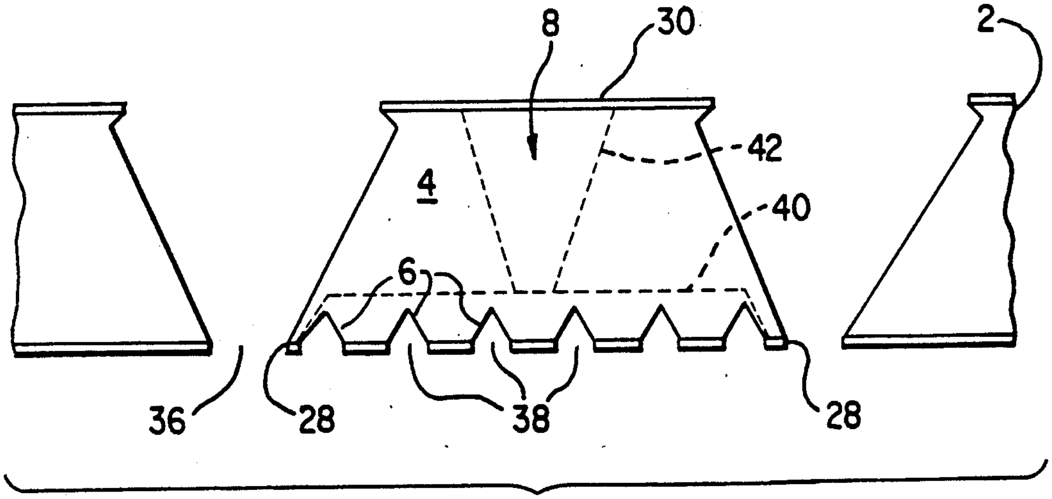

As shown in FIG. 6*b*, etch resistant layer 32 located on the base surface of silicon wafer 2 is then patterned and removed by plasma etching to form a first set of base etch openings 36 having locations and dimensions which define predetermined locations and dimensions of a plurality of side edges 28 of each channel plate 4. Each opening 36 in the first set of base etch openings are aligned with a corresponding upper etch opening 34 within a predetermined tolerance for reasons to be described below. Etch resistant layer 32 is also patterned and removed to form a second set of base etch openings 38 which have locations and dimensions which define predetermined locations and dimensions of a plurality of channels 6. The second set of base etch openings 38 are aligned with the first set of base etch openings 36. Silicon wafer 2 is again anisotropically etched to produce a plurality of base recesses corresponding to the first set of base etch openings 36. Each of the base recesses corresponding to the first set of base etch openings 36 intersect an upper recess formed by etching through upper etch openings 34. The intersection of upper and base recesses is assured by aligning the upper etch openings with the first set of base etch openings within a predetermined tolerance. The step of patterning the etch resistant layer to form the upper and base etch openings can be done using a double sided aligner, although alternative methods can also be used. Each of the upper and base recesses are bounded by (111) plane side walls so that when they intersect one another, the ultimate size of the slot 26 formed by the upper and base recesses is controlled by the location and dimension of the first set of base etch openings 36. This phenomenon is further explained in the above-incorporated U.S. patent application Ser. No. 07/440,296. Since the locations of channel grooves 6 are controlled by the locations of the second set of base etch openings 38 which are aligned with the first set of base etch openings 36, channel plates formed by the present invention will have a series of channels 6 which are precisely delineated relative to side edges 28 thereof. Fill holes 8, shown in FIG. 3, can be patterned and etched through the base surface of wafer 2 as in the above-mentioned U.S. Pat. No. 4,851,371. Alternatively, fill hole 8 could be formed by patterning and etching the base surface of wafer 2 to form an ink manifold 40 which extends across a sufficient width of channel plate 4 to supply all of the ink channels 6 thereon with ink but only extends partially through the thickness of wafer 2 and intersecting manifold 40 with a supply hole 42 that extends from the upper surface of silicon wafer 2 and is formed by patterning and etching the upper surface of silicon wafer 2. Such a structure for forming fill hole 8 is disclosed in U.S. Pat. No. 4,786,357 to Campanelli et al.

The upper surface of wafer 2 can be patterned and etched prior to patterning and etching the base surface of silicon wafer 2 or both surfaces can be simultaneously patterned and etched. Additionally, while silicon nitride can be used as the etch resistant material, plasma silicon nitride which can be applied at a temperature between 250° Celsius and 450° Celsius can also be used.

The invention has been described with reference to the preferred embodiments thereof which are intended to be illustrative rather than limiting. For example, while a method of fabricating a printhead for a thermal ink jet printer which uses resistive elements located on a heater plate has been described, the present invention is applicable to any type of device which requires the precise alignment of formations such as channels on a surface of a silicon wafer relative to the end surface of the silicon wafer. For example, the present invention could also be used to produce ionographic printheads which utilize piezoelectric elements instead of resistive elements. Various changes and modifications may be made without departing from the spirit and scope of the invention as defined in the following claims.

What is claimed is:

1. A method of fabricating a channel plate for an ink jet printhead from a (100) silicon wafer, the method comprising the steps of:

obtaining a (100) silicon wafer having an upper surface and an opposite base surface;

applying an etch resistant layer on said upper and base surfaces of said wafer;

patterning the etch resistant layer on said upper surface to produce a plurality of upper etch openings;

patterning the etch resistant layer on said base surface to produce a first set of base etch openings having locations and dimensions which define predetermined locations and dimensions of a plurality of side edges of said channel plate, said first set of base etch openings each aligned with a corresponding upper etch opening within a predetermined tolerance, and a second set of base etch openings having locations and dimensions which define predetermined locations and dimensions of a plurality of channels, said second set of base etch openings being aligned with said first set of base etch openings; and anisotropically etching said wafer to produce a plurality of upper recesses corresponding to the upper etch openings in the upper surface and a plurality of lower recesses corresponding to the first set of base etch openings in the base surface, each of the upper and base recesses being bounded by (111) plane sidewalls, the anisotropic etching of the base recesses intersecting the upper recesses and forming a plurality of through holes, said anisotropic etching also producing a plurality of channels in said base surface corresponding to said second set of base etch openings.

2. The method according to claim 1, wherein the upper etch openings are patterned and etched prior to patterning and etching the first and second sets of base etch openings.

3. The method according to claim 1, further comprising forming at least one fill hole through said wafer between said upper and base surfaces.

4. The method according to claim 3, wherein said at least one fill hole is formed by patterning the etch resistant layer on said upper surface to produce at least one supply hole opening and wherein said step of anisotropically etching said wafer also produces a supply hole corresponding to said supply hole opening.

5. The method according to claim 4, wherein said supply hole extends entirely through said wafer from said upper surface to said base surface to form said fill hole.

6. The method according to claim 4, wherein said supply hole extends partially through said wafer from said upper surface and wherein said fill hole is further formed by patterning the etch resistant layer on said base surface to produce a manifold hole opening and wherein said step of anisotropically etching said wafer also produces a manifold hole corresponding to said manifold hole opening which extends partially through said wafer from said base surface and intersects said supply hole.

7. The method according to claim 1, wherein said etch resistant layers are applied at a temperature between 250° C. and 450° C.

8. The method according to claim 1, wherein said etch resistant layers are plasma silicon nitride.

9. The method according to claim 1, wherein a plurality of channel plates are formed on said (100) silicon wafer and are arranged in horizontal rows and vertical columns thereon.

10. The method according to claim 9, further comprising separating said wafer between said horizontal rows and vertical columns to form a plurality of channel plates, said through holes forming side edges of said channel plates.

11. A method of fabricating ink jet printhead subunits from a channel plate and an actuator plate comprising:

obtaining a first (100) silicon wafer having an upper surface and an opposite base surface;

applying an etch resistant layer on said upper and base surfaces of said first (100) silicon wafer;

patterning the etch resistant layer on said upper surface to produce a plurality of sets of upper etch openings;

patterning the etch resistant layer on said base surface to produce a plurality of sets of first base etch openings having locations and dimensions which define predetermined locations and dimensions of a plurality of side edges of channel plates, each first base etch opening of each set of first base etch openings being aligned with a corresponding upper etch opening of each set of upper etch openings within a predetermined tolerance, and a plurality of sets of second base etch openings having locations and dimensions which define predetermined locations and dimensions of a plurality of channels, each set of second base etch openings being aligned with a set of first base etch openings, wherein said plurality of sets of upper etch openings, first base etch openings and second base etch openings are arranged in corresponding horizontal rows and vertical columns on said first (100) silicon wafer;

anisotropically etching said first (100) silicon wafer to produce a plurality of sets of upper recesses corresponding to the plurality of sets of upper etch openings in the upper surface and a plurality of sets of base recesses corresponding to the plurality of sets of first base etch openings in the base surface, each of the upper and base recesses being bounded by (111) plane sidewalls, the anisotropic etching of the base recesses intersecting the upper recesses and forming a plurality of sets of through holes, each through hole defining a side edge of a channel plate, said anisotropic etching also producing a plurality of sets of channels in said base surface corresponding to said plurality of sets of second base etch openings;

obtaining a second (100) silicon wafer having a plurality of actuating elements on an upper surface thereof, said actuating elements being arranged in sets corresponding in number and position to the sets of channels formed in said base surface of said first (100) silicon wafer;

bonding said base surface of said first (100) silicon wafer to the upper surface of said second (100) silicon wafer so that individual actuating elements are located in individual channels to form a wafer sandwich containing a plurality of printhead subunits arranged in horizontal rows and vertical columns;

separating said wafer sandwich between each horizontal row to form a plurality of rows of printheads; and separating said rows of printheads into individual printhead subunits.

12. The method according to claim 11, wherein said rows of printheads are separated into individual printhead subunits by dicing through only said second (100) silicon wafer.

13. The method according to claim 11, wherein said actuating elements are resistive elements.

14. The method according to claim 11, wherein the plurality of sets of upper etch openings are patterned and etched prior to patterning and etching the plurality of sets of first and second base etch openings.

15. The method according to claim 11, further comprising forming at least one fill hole through said wafer for each set of channels between said upper and base surfaces.

16. The method according to claim 11, wherein said at least one fill hole is formed by patterning the etch resistant layer on said upper surface to produce at least one supply hole opening and wherein said step of anisotropically etching said first (100) silicon wafer also produces at least one supply hole for each set of channels corresponding to said at least one supply hole opening.

17. The method according to claim 16, wherein said at least one supply hole extends entirely through said first (100) silicon wafer from said upper to said base surface to form said at least one fill hole.

18. The method according to claim 16, wherein said at least one supply hole extends partially through said first (100) silicon wafer from said upper surface and wherein said at least one fill hole is further formed by patterning the etch resistant layer on said base surface to produce at least one manifold hole opening for each set of channels and wherein said step of anisotropically etching said first (100) silicon wafer also produces at least one manifold hole for each set of channels corresponding to said at least one manifold hole opening which extends partially through said wafer from said base surface and intersects said at least one supply hole.

19. The method according to claim 11, wherein said etch resistant layers are applied at a temperature between 250° C. and 450° C.

20. The method according to claim 11, wherein said etch resistant layers are plasma silicon nitride.

* * * * *